United States Patent
Wang et al.

(10) Patent No.: US 11,646,323 B2
(45) Date of Patent: May 9, 2023

(54) ARRAY SUBSTRATE, DISPLAY PANEL AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Min Wang, Beijing (CN); Rui Xu, Beijing (CN); Shaobo Li, Beijing (CN); Guangquan Wang, Beijing (CN); Chao Tian, Beijing (CN); Zhe Wang, Beijing (CN); Meng Gong, Beijing (CN); Yongchun Lu, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 225 days.

(21) Appl. No.: 16/910,632

(22) Filed: Jun. 24, 2020

(65) Prior Publication Data
US 2021/0005631 A1    Jan. 7, 2021

(30) Foreign Application Priority Data
Jul. 4, 2019    (CN) .......................... 201910598400.X

(51) Int. Cl.
*H01L 27/12*    (2006.01)
*G02F 1/136*    (2006.01)

(52) U.S. Cl.
CPC ............ *H01L 27/124* (2013.01); *G02F 1/136* (2013.01)

(58) Field of Classification Search
CPC ............. G02F 1/134336; G02F 1/1345; G02F 1/13456; G02F 1/136286; G09G 3/3648; G09G 2300/0426
USPC .................................................. 349/149–152
See application file for complete search history.

(56) References Cited

U.S. PATENT DOCUMENTS

| | | | | |
|---|---|---|---|---|
| 6,104,465 A | * | 8/2000 | Na | G02F 1/1345 349/152 |
| 2013/0141660 A1 | * | 6/2013 | Wang | H01L 27/156 257/59 |
| 2014/0043306 A1 | * | 2/2014 | Min | G09G 3/3677 345/204 |

(Continued)

*Primary Examiner* — Edward J Glick
*Assistant Examiner* — David Y Chung
(74) *Attorney, Agent, or Firm* — Myers Bigel, P.A.

(57) ABSTRACT

An array substrate, a display panel and a display device are provided by the present disclosure. The array substrate includes a plurality of pixel structures in a display area of the array substrate and arranged in rows and columns, a plurality of first driving signal wires extending in a row direction; and a plurality of leads extending in a row direction, the plurality of leads including a plurality of first-type leads and at least one second-type lead. A respective first driving signal wire is electrically connected to a row of the pixel structures and is electrically connected to a respective first-type lead via a first electrical connection point. The at least one second-type lead is electrically connected to a respective first driving signal wire via a second electrical connection point and is connected in parallel with a corresponding first-type lead electrically connected to the respective first driving signal wire.

19 Claims, 15 Drawing Sheets

(56) References Cited

U.S. PATENT DOCUMENTS

2016/0093261 A1* 3/2016 Kawamura ........... G02F 1/1345
  345/204
2016/0093640 A1* 3/2016 Kawamura ........... H01L 27/124
  257/72

* cited by examiner ations No. 201910598400.X filed on Jul. 4, 2019, the entire disclosure of which is incorporated herein by reference.

ARRAY SUBSTRATE, DISPLAY PANEL AND DISPLAY DEVICE

RELATED APPLICATION

This application claims the priority of China Patent Application No. 201910598400.X filed on Jul. 4, 2019, the entire disclosure of which is incorporated herein by reference.

TECHNICAL FIELD

The present disclosure relates to the field of display technologies, and particularly to an array substrate, a display panel, and a display device.

BACKGROUND

With the rapid development of display technologies, display devices with display functions have been widely used in our lives. In order to improve user experience, display products with narrow bezels or ultra-narrow bezels have brought great interest in the display industry. A solution to reduce the size of the bezel of the display panel is that a part of the leads for connecting the gate lines or data lines may be drawn out from the display area to the fan-out area of the display panel, thereby increasing the proportion of the display area in the entire screen, enabling users to get a better experience.

SUMMARY

According to some embodiments of the present disclosure, there is provided an array substrate, comprising a plurality of pixel structures in a display area of the array substrate and arranged in rows and columns; a plurality of first driving signal wires extending in a row direction; and a plurality of leads extending in a column direction crossing the row direction, the plurality of leads comprising a plurality of first-type leads and at least one second-type lead. A respective one of the plurality of first driving signal wires is electrically connected to a respective row of the plurality of pixel structures and is electrically connected to a respective one of the plurality of first-type leads via a first electrical connection point. The at least one second-type lead is electrically connected to a respective one of the plurality of first driving signal wires via a second electrical connection point and is connected in parallel with a corresponding first-type lead electrically connected to the respective one of the plurality of first driving signal wires.

In some embodiments, the first-type lead and the second-type lead connected in parallel are in a same column or different columns of the pixel structures.

In some embodiments, a plurality of the first electrical connection points are substantially in a straight line in a first direction, the first direction crosses the row direction and the column direction respectively.

In some embodiments, a plurality of the second electrical connection points are substantially in another straight line in a direction parallel to the first direction.

In some embodiments, a plurality of the second electrical connection points are substantially in a straight line in a second direction, the second direction crosses the row direction, the column direction and the first direction respectively.

In some embodiments, the plurality of pixel structures are arranged in an M×N array, the number of the first-type leads is M, the number of the second-type leads is (2N−M), the relationship between M and N satisfies 2N>M>N, and both M and N are positive integers greater than 1.

In some embodiments, columns of the plurality of pixel structures comprise a same number of leads.

In some embodiments, the array substrate further comprises at least one first connection wire and at least one second connection wire. One ends of the first-type lead and the second-type lead connected in parallel are electrically connected via the at least one first connecting wire, and the other ends of the first-type lead and the second-type lead connected in parallel are electrically connected via the at least one second connection wire.

In some embodiments, the array substrate further comprises a fan-out area in a non-display area of the array substrate. The fan-out area comprises a plurality of first fan-out wires, and a respective one of the plurality of first fan-out wires is electrically connected to a respective one of the plurality of first-type leads.

In some embodiments, the array substrate further comprises at least one first driving circuit. The at least one first driving circuit is electrically connected to the plurality of first fan-out wires to transmit driving signals to the plurality of first driving signal wires. Each of the plurality of first-type leads has substantially the same transmission load.

In some embodiments, each of the plurality of first-type leads comprises a first sub-lead portion and a second sub-lead portion spaced apart from each other. The first sub-lead portion is electrically connected to a respective one of the plurality of first driving signal wires via the first electrical connection point, and the second sub-lead portion is floating. The at least one second-type lead comprises a third sub-lead portion and a fourth sub-lead portion spaced apart from each other. The third sub-lead portion is electrically connected to a respective one of the plurality of first driving signal wires via the second electrical connection point, and the fourth sub-lead portion is floating. The third sub-lead portion of the at least one second-type lead is connected in parallel with the first sub-lead portion of the respective one of the plurality of first-type leads.

In some embodiments, one of the plurality of first driving signal wires has a first orthographic projection on the array substrate, a gap between the first sub-lead portion and the second sub-lead portion of a corresponding first-type lead electrically connected to the first driving signal wire has a second orthographic projection on the array substrate, and the first orthographic projection covers the second orthographic projection.

In some embodiments, one of the plurality of first driving signal wires has a first orthographic projection on the array substrate, a gap between the third sub-lead portion and the fourth sub-lead portion of the at least one second-type lead electrically connected to the first driving signal wire has a third orthographic projection on the array substrate, and the first orthographic projection covers the third orthographic projection.

In some embodiments, the plurality of pixel structures comprise a middle column portion and edge column portions on both sides with respect to the first driving circuit. A maximum distance between the first electrical connection points at the edge column portions on both sides and the first driving circuit is a first distance, a minimum distance between the first electrical connection points at the middle column portion and the first driving circuit is a second distance, and the first distance is smaller than the second distance. Lengths of the first fan-out wires corresponding to the edge column portions on both sides are longer than lengths of the first fan-out wires corresponding to the middle column portion.

In some embodiments, the array substrate further comprises a plurality of second driving signal wires extending in the column direction. A respective one of the plurality of second driving signal wires is electrically connected to a respective column of the plurality of pixel structures.

In some embodiments, the fan-out area further comprises a plurality of second fan-out wires. A respective one of the plurality of second fan-out wires is electrically connected to a respective one of the plurality of second driving signal wires. The array substrate further comprises at least one second driving circuit, the plurality of second fan-out wires are electrically connected to the at least one second driving circuit.

In some embodiments, the first driving circuit and the second driving circuit are integrated into a same driving circuit.

In some embodiments, the first driving signal wire is selected from one of a data line and a gate line, and the second driving signal wire is selected from the other of the data line and the gate line.

According to some embodiments of the present disclosure, there is provided a display panel comprising the array substrate described in any of the above embodiments.

According to some embodiments of the present disclosure, there is provided a display device comprising the array substrate described in any of the above embodiments.

BRIEF DESCRIPTION OF THE DRAWINGS

Other objects and features of the present disclosure will become apparent from the following detailed description considered in conjunction with the accompanying drawings. It should be understood, however, that the drawings are designed for the purpose of illustration only and not as a definition of the limits of the disclosure. In the drawings:

FIG. 11b is a partial cross-sectional view taken along the AA' direction of the array substrate shown in FIG. 11a;

FIG. 11c is a partial cross-sectional view taken along the AA' direction of the array substrate shown in FIG. 11a;

In the drawings, the same reference numerals in various drawings generally refer to the same or similar parts. Moreover, the drawings are not necessarily drawn to scale, emphasis instead generally being placed upon illustrating the principles of the present disclosure.

DETAILED DESCRIPTION OF THE DISCLOSURE

Figure 1:
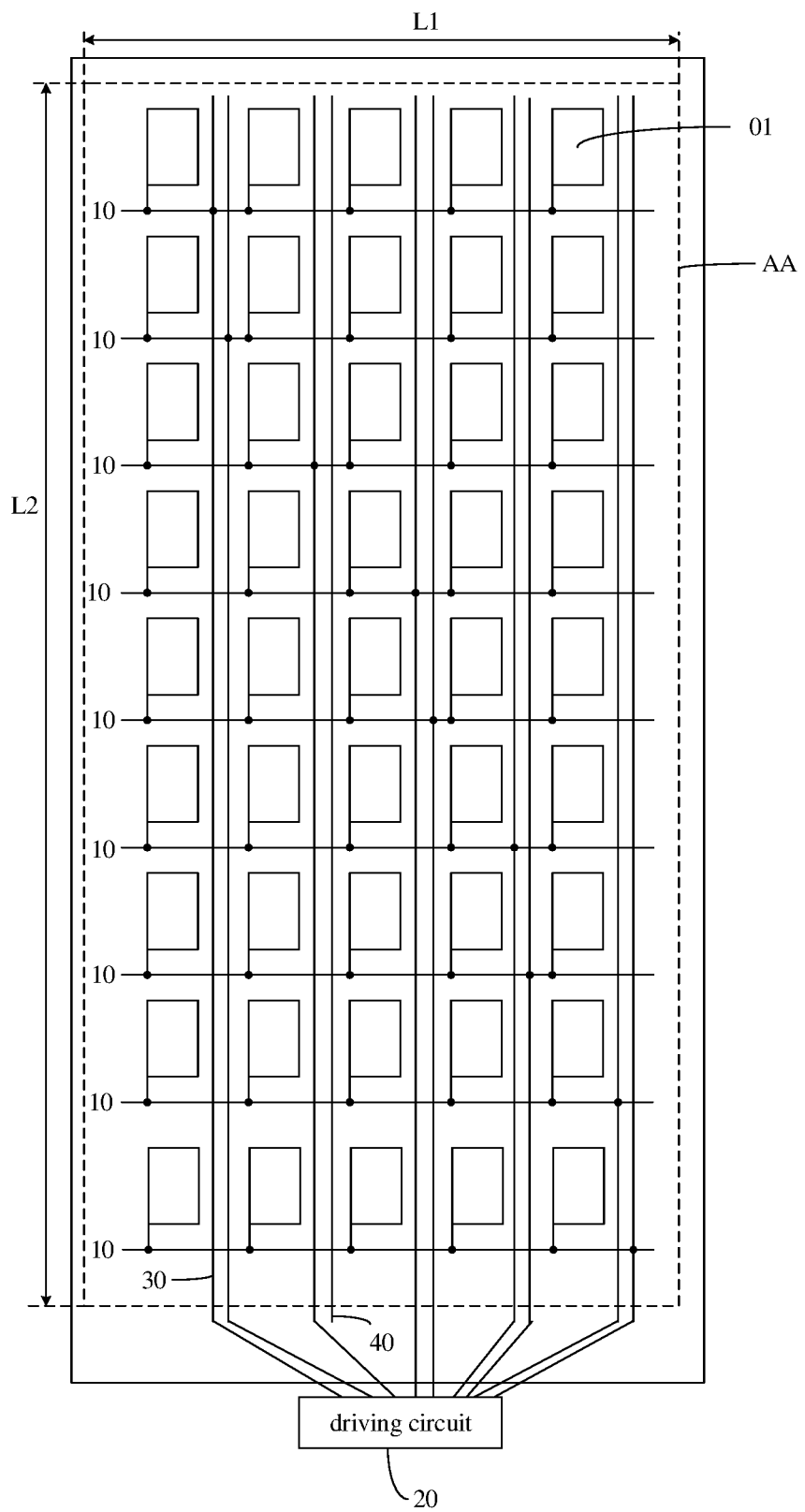
FIG. 1 is a schematic diagram of a partial planar structure of an array substrate in the related art.

To make the objectives, technical solutions, and advantages of the embodiments of the present disclosure clearer, the technical solutions of the embodiments of the present disclosure will be described clearly and fully in conjunction with the drawings of the embodiments of the present disclosure. The described embodiments are only a part of the embodiments of the present disclosure, instead of all the embodiments.

The embodiments in the present disclosure and the features in the embodiments may be combined without conflict. Based on the embodiments described of the present disclosure, all other embodiments obtained by a person of ordinary skill in the art without undue experimentation fall within the scope of protection of the present disclosure.

Unless otherwise defined, the technical terms or scientific terms used herein have the same meaning as commonly understood by one of ordinary skill in the art to which this disclosure belongs. The terms "first", "second" and similar words used in this disclosure do not indicate any order, quantity or importance, but are only used to distinguish different components. The words such as "comprise" or "include" mean that the elements or objects before the word cover the elements or objects listed after the word and equivalents thereof, but do not exclude other elements or objects. The words such as "connected" or "connection" are not limited to physical or mechanical connections, but may include electrical connections, whether direct or indirect.

It should be noted that the size and shape of figures in the drawings do not reflect the true scale, and the purpose is only to illustrate the disclosure. The same or similar reference numerals throughout indicate the same or similar elements or elements with the same or similar functions.

With the rapid development of display technologies, in order to reduce the width of the bezel of the display screen, the driving circuit may be arranged below the display area. A display device may generally include an array substrate. As shown in FIG. 1, the display area AA of the array substrate may include a plurality of pixel structures 01, and a plurality of signal lines 10 extending along a row direction of the pixel structure 01, with a row of pixel structure being electrically connected to one signal line 10. Since the driving circuit 20 is disposed below the display area AA (for example, the bonding area of the array substrate), in order to input a signal to the signal line 10, a plurality of transmission leads 30 are generally provided. One end of each transmission lead 30 is electrically connected to the driving circuit 20, and the other end of each transmission lead 30 is electrically connected to a different signal line 10, so that the signals from the driving circuit 20 are input to the signal lines 10 through the transmission leads 30.

In practical applications, due to the influence of the user's visual preferences or the needs of use scenario, as shown in FIG. 1, the ratio of the short side L1 to the long side L2 of the display area AA is generally L1:L2=3:4 or L1:L2=9:16, so that the total number of rows of pixels is greater than the total number of columns of pixels in the display area AA. Moreover, the ratio of the total number of rows to the total number of columns is usually not an integer, which causes that the number of transmission leads 30 corresponding to some column pixels is different from the number of transmission leads 30 corresponding to the other column pixels, resulting in different sizes and characteristics between pixels. For example, FIG. 1 shows nine rows and five columns of pixels, so that the number of signal lines 10 is nine and the number of transmission leads 30 is also nine accordingly. However, since there are five columns of pixels, the first column, the third column, the fourth column, and the fifth column of pixels are provided with two adjacent transmission leads 30, and the second column of pixels is provided with one transmission lead 30. Therefore, the size and characteristic of the second column of pixels are different from those in the remaining columns.

The different sizes and characteristics of the pixels cause differences in the display effects of the pixels. Therefore, in order to make the size and characteristic of each pixel substantially the same, a dummy lead 40 may be provided for a column of pixels with fewer transmission leads 30, for example, a dummy lead 40 may be provided for the second column of pixels in FIG. 1. The dummy lead 40 is floating, that is to say, the dummy lead 40 is not electrically connected to other signal lines or films. In addition, the lengths, cross-sectional areas of the dummy lead 40 and the transmission lead 30 are substantially same. However, since the leads in the second column of pixels include both the transmission lead 30 and the dummy lead 40 that is floating, and the leads in the other columns of pixels include two same transmission leads 30, the influence of the transmission lead 30 in the second column by its adjacent dummy lead 40 is different from that of the transmission lead 30 in the other columns by its adjacent transmission lead 30, resulting in a load on the transmission lead 30 in the second column being different from the load of the transmission lead 30 in the other columns. In this way, the signal delay time of the signal line 10 electrically connected to the transmission lead 30 in the second column is different from those of the signal lines 10 electrically connected to the transmission leads 30 in the other columns, resulting in different charging rates of the pixels in each row and hence a poor display uniformity.

Figure 2:
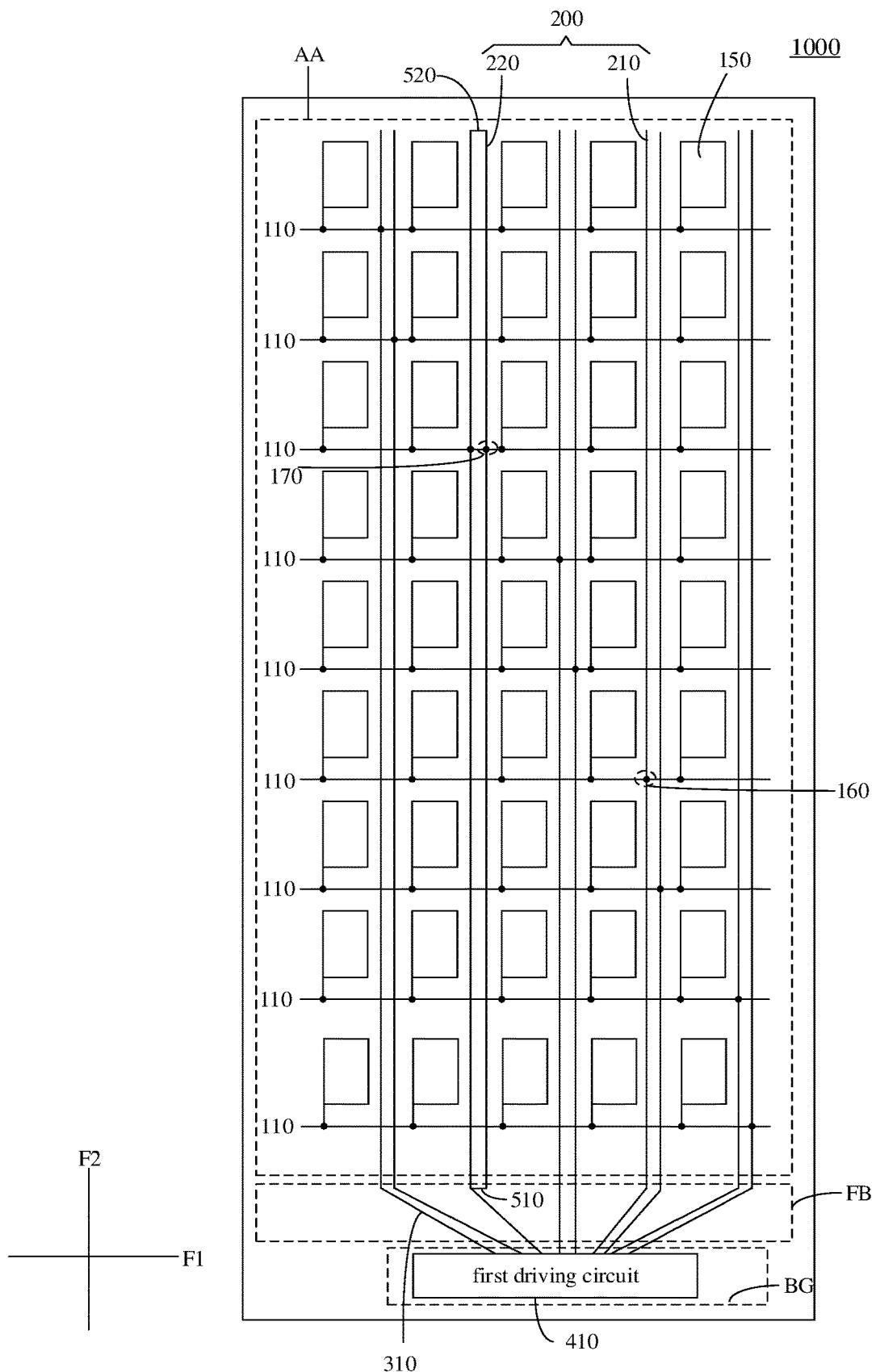
FIG. 2 is a schematic diagram of a partial planar structure of an array substrate according to an embodiment of the present disclosure.

In view of this, an embodiment of the present disclosure provides an array substrate. As shown in FIG. 2, the array substrate 1000 includes: a plurality of pixel structures 150 located in a display area AA of the array substrate 1000 and arranged in rows and columns; a plurality of first driving signal wires 110 extending in a row direction F1; and a plurality of leads 200 extending in a column direction F2 crossing the row direction F1. The plurality of leads 200 includes a plurality of first-type leads 210 and at least one second-type lead 220. A respective one of the plurality of first driving signal wires 110 is electrically connected to a respective row of the plurality of pixel structures 150 and is electrically connected to a respective one of the plurality of first-type leads 210 via a first electrical connection point 160. At least one second-type lead 220 is electrically connected to a respective one of the plurality of first driving signal wires 110 via a second electrical connection point 170 and is connected in parallel with a corresponding first-type lead 210 electrically connected to the respective one of the plurality of first driving signal wires 110.

As shown in FIG. 2, the array substrate 1000 includes nine first driving signal wires 110 extending in the row direction F1 and ten leads 200 extending in the column direction F2. The ten leads 200 include nine first-type leads 210 and one second-type lead 220. Each column of pixels includes two leads 200. Specifically, each of the first column, the third column, the fourth column, and the fifth column of pixels includes two first-type leads 210, and the second column of pixels includes one first-type lead 210 and one second-type lead 220. It should be noted that the numbers of the first driving signal wire 110, the first-type lead 210 and the second-type lead 220 are provided as examples only, and they may be any other suitable numbers, which will be further described in detail below.

In FIG. 2, each row of pixels is electrically connected to one first driving signal wire 110, and different rows of pixels are electrically connected to different first driving signal wires 110, to transmit signals to respective rows of pixels through the plurality of first driving signal wires 110. Each first driving signal wire 110 is electrically connected to a respective first-type lead 210, so that a signal may be transmitted to the first driving signal wire 110 through the first-type lead 210. In addition, one second-type lead 220 is electrically connected to a respective first driving signal wire 110 and is connected in parallel with a corresponding first-type lead 210 electrically connected to the respective first driving signal wire 110, thereby reducing the transmission load of the first-type lead 210.

The array substrate 1000 further includes at least one first connection wire 510 and at least one second connection wire 520, one ends of the first-type lead 210 and the second-type lead 220 connected in parallel are electrically connected via the first connection wire 510, and the other ends of the first-type lead 210 and the second-type lead 220 connected in parallel are electrically connected via the second connection wire 520. Exemplarily, one ends of the second-type lead 220 and the first-type lead 210 may be electrically connected via one first connection wire 510, or via two first connection wires 510, so as to improve the performance of the electrical connection. Accordingly, the other ends of the second-type lead 220 and the first-type lead 210 may be electrically connected via one second connection wire 520, or via two second connection wires 520, so as to improve the performance of the electrical connection. Of course, the embodiments of the present disclosure include but are not limited to this, and their electrical connection may also be other arrangements, which is not limited herein. The first connection wire 510 may be disposed in the fan-out area FB or the display area AA, and the second connection wire 520 may be disposed in the display area AA, which is not limited in this embodiment.

By connecting the second-type lead 220 to the first-type lead 210 in parallel, the resistance R of the first-type lead 210 may be reduced, and the capacitance C of the first-type lead 210 may be increased, so that the load of the first-type lead 210 connected in parallel with the second-type lead 220 is basically unchanged. This is based on the following fact: the load of the first-type lead 210 is RC when the second-type lead 220 is not connected in parallel with the first-type lead 210. After the first-type lead 210 is connected in parallel with the second-type lead 220, the resistance R' of the first-type lead 210 is reduced by about half, that is R'=½R, and the capacitance C' of the first-type lead 210 is approximately doubled, that is, C'=2C, therefore, the load of the first-type lead 210 connected in parallel with the second-type lead 220 satisfies R'C'=RC. Therefore, by connecting the second-type lead 220 to the first-type lead 210 in parallel, the load of the first-type lead 210 in the second column is substantially the same as that of the first-type lead 210 in the adjacent column which is not connected in parallel with the second-type lead 220. In addition, the delay time (τ) of the signal input to the first driving signal wire 110 satisfies τ∝RC, since RC=R'C', the first driving signal wire 110 electrically connected to the first-type lead 210 connected in parallel with the second-type lead 220 and other first driving signal wires 110 electrically connected to the first-type leads 210 which are not connected in parallel with the second-type leads 220 have substantially the same signal delay time. Therefore, the pixels in each row have substantially the same charging time and charging rate, so that a substantially uniform display effect may be achieved in the entire pixel.

It should be noted that, although FIG. 2 shows that a row of pixels is electrically connected to one first driving signal wire 110, one first driving signal wire 110 is electrically connected to one first-type lead 210, and one second-type lead 220 is connected in parallel with one first-type lead 210, the number of first driving signal wires 110 electrically connected to one row of pixels, the number of first-type leads 210 electrically connected to one first driving signal wire 110, and the number of second-type leads 220 connected in parallel with one first-type lead 210 may be designed according to actual needs, and are not limited herein.

In the example shown in FIG. 2, each of the first-type leads 210 and the second-type lead 220 are a continuous lead. That is to say, each of the first-type leads 210 and the second-type lead 220 extend from the fan-out area FB to the top edge of the display area AA along the column direction F2 of the pixel without being disconnected in the middle.

In an alternative embodiment, the first-type lead 210 and the second-type lead 220 are disposed in the same layer and made of the same material. In this way, the first-type lead 210 and the second-type lead 220 may be formed through one patterning process, thereby reducing the complexity of process and saving costs.

As shown in FIG. 2, the array substrate 1000 further includes a fan-out area FB at an end of the lead (that is, the bottom end in FIG. 2). The fan-out area FB includes a plurality of first fan-out wires 310. A respective one of the plurality of first fan-out wires 310 is electrically connected to a respective one of the plurality of first driving signal wires 110 via a respective first-type lead 210, that is, one first fan-out wire 310 corresponds to one first driving signal wire 110. A transmission path which the driving signal (which will be described further below) is transmitted from the first fan-out wire 310 to the respective first driving signal wire 110 has a driving signal transmission load.

In the case where a column of pixels includes only the first-type leads 210 (i.e., the first column, the third column, the fourth column, and the fifth column of pixels in FIG. 2), the first driving signal wire 110 is electrically connected to the respective first fan-out wire 310 through the respective first-type lead 210. In this way, the driving signal may be transmitted to the first driving signal wire 110 along the transmission path formed by the first fan-out wire 310 and the first-type lead 210. In the case where a column of pixels includes the first-type lead 210 and the second-type lead 220 ((i.e., the second column of pixels in FIG. 2), the first driving signal wire 110 is electrically connected to the respective first fan-out wire 310 through the respective first-type lead 210 and second-type lead 220. In this way, the driving signal may be transmitted to the first driving signal wire 110 along the transmission path formed by the first fan-out wire 310, and the first-type lead 210 and the second-type lead 220 connected in parallel.

In above two cases, the first fan-out wires 310 may have substantially the same resistance, so that each column of pixels has approximately the same load. In this way, the delay time of the signal input to each first driving signal wire 110 may be substantially the same, so that each row of pixels may have substantially the same charging time and charging rate, thereby further improving display uniformity.

Figure 5:
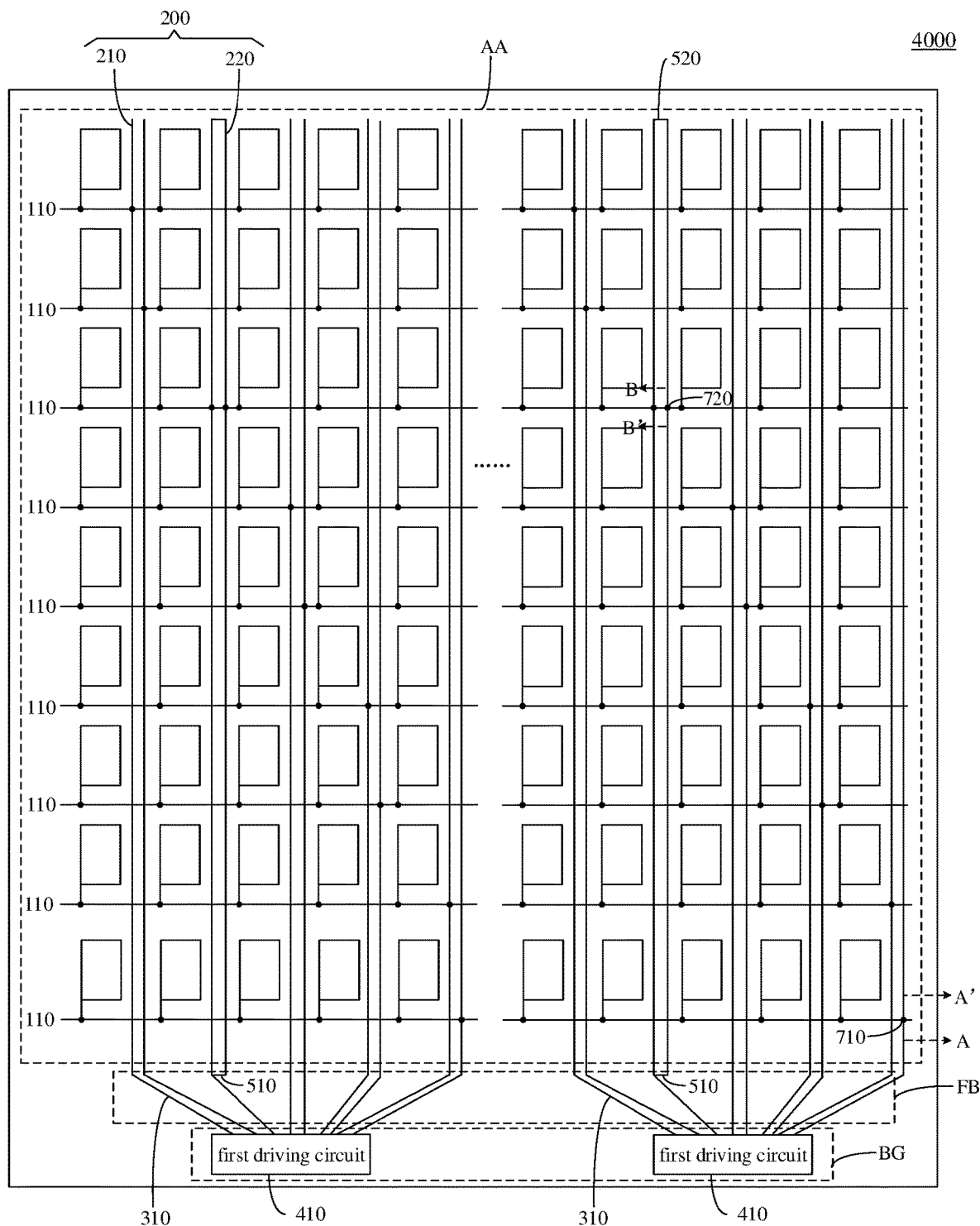
FIG. 5 is a schematic diagram of a partial planar structure of an array substrate according to an embodiment of the present disclosure.

As shown in FIG. 2, the array substrate 1000 further includes a first driving circuit 410. The first driving circuit 410 is electrically connected to the plurality of first fan-out wires 310 to transmit the driving signal to the respective first driving signal wire 110. Specifically, the array substrate 1000 includes a bonding area BG on a side of the fan-out area FB facing away from the display area AA, and the bonding area BG includes a first driving circuit 410. All the first-type leads 210 shown in FIG. 2 are connected to the same first driving circuit 410 through respective first fan-out wires 310. In an alternative embodiment, as shown in FIG. 5, the array substrate 4000 includes two first driving circuits 410. The first-type leads 210 that are relatively closer to one of the two first driving circuits 410 (for example, the left first driving circuit 410 in FIG. 5) constitute a first lead group, and the first-type leads 210 that are relatively closer to the other of the two first driving circuits 410 (for example, the right first driving circuit 410 in FIG. 5) constitute a second lead group. The first lead group is electrically connected to the left first driving circuit 410 through the respective first fan-out wires 310, and the second lead group is electrically connected to the right first driving circuit 410 through the respective first fan-out wires 310. Of course, the arrangement of the first driving circuit 410 is not limited to this, and those skilled in the art may also design other arrangements according to actual needs, which is not limited in this embodiment.

In an alternative embodiment, the load of each first-type lead 210 and the load of each second-type lead 220 are substantially the same, and the load of each first fan-out wire 310 in the fan-out area FB is substantially the same. Alternatively, the loads of a portion of the first-type leads 210 may be substantially the same, and the loads of the remaining portion of the first-type leads 210 may be slightly different. By adjusting the load of the first fan-out wire 310 electrically connected to the first-type lead 210, the driving signal transmission load is basically the same. In this way, the delay time of signals output by the first driving circuit 410 and then loaded on the first driving signal wires 110 through the first fan-out wires 310 and the first-type leads 210 may be substantially the same.

Figure 3:
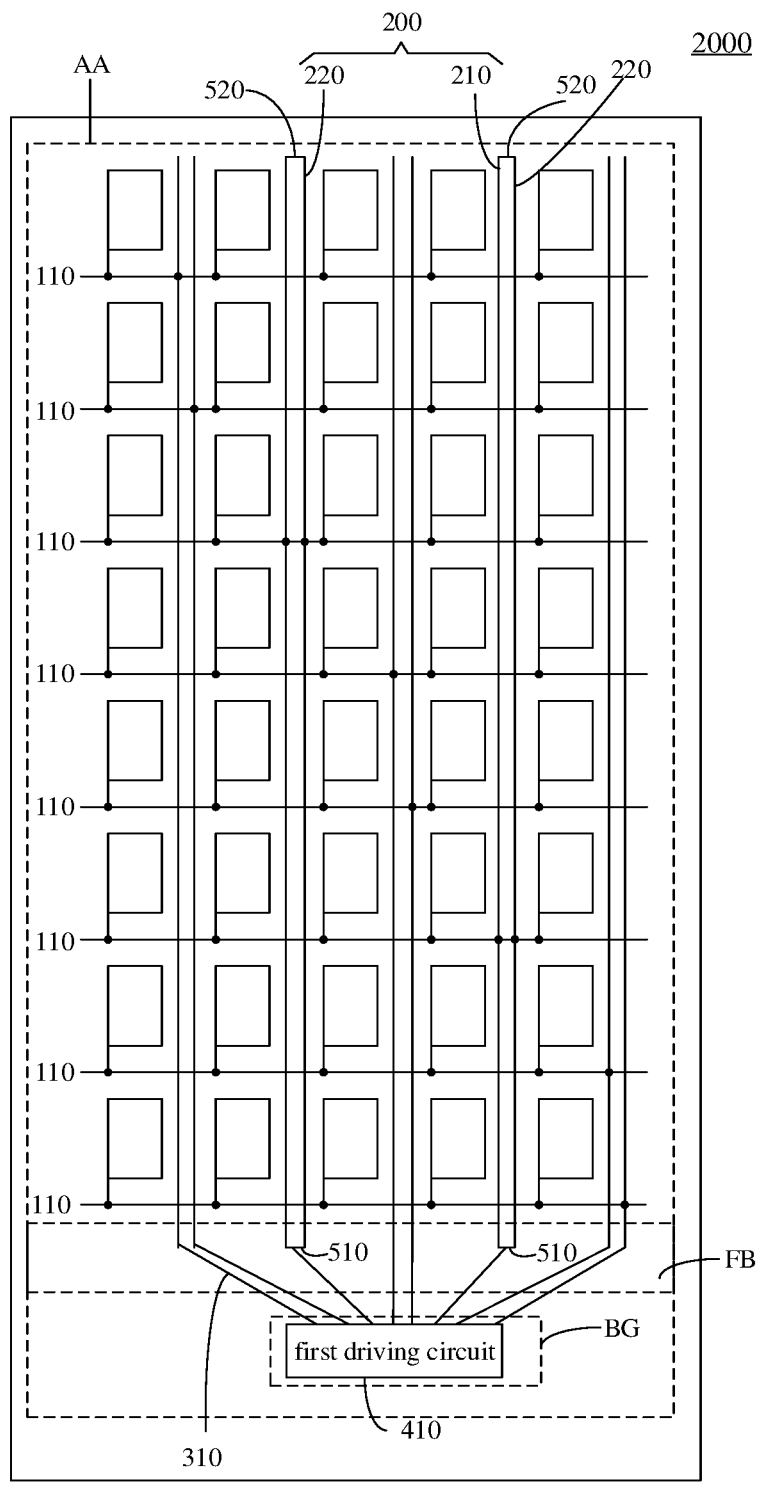
FIG. 3 is a schematic diagram of a partial planar structure of an array substrate according to an embodiment of the present disclosure.

FIG. 3 shows a schematic diagram of a partial planar structure of an array substrate 2000 according to another embodiment of the present disclosure. The structure of the array substrate 2000 in this example is basically the same as the structure of the array substrate 1000 described in FIG. 2 except for the numbers of first-type leads 210, second-type leads 220, and first driving signal wires 110. Therefore, for the sake of brevity, only the differences between this embodiment and the above-mentioned embodiments are described below, and the similarities are not repeated herein.

As shown, the array substrate 2000 includes eight first driving signal wires 110 extending in the row direction F1 and ten leads 200 extending in the column direction F2. The ten leads 200 include eight first-type leads 210 and two second-type leads 220. Each second-type lead 220 and a respective one of the first-type leads 210 are located in the same column of pixels and connected in parallel with each other. Specifically, the second column of pixels includes one first-type lead 210 and one second-type lead 220 connected in parallel, and the fourth column of pixels includes one first-type lead 210 and one second-type lead 220 connected in parallel. The first-type lead 210 located in the second column of pixels is electrically connected to the first driving signal wire 110 in the third row via the first electrical connection point 160, and the second-type lead 220 located in the second column of pixels is electrically connected to the first driving signal wire 110 in the third row via the second electrical connection point 170. The first-type lead 210 located in the fourth column of pixels is electrically connected to the first driving signal wire 110 in the sixth row via the first electrical connection point 160, and the second-type lead 220 located in the fourth column of pixels is electrically connected to the first driving signal wire 110 in the sixth row via the second electrical connection point 170. With an arrangement including two first-type leads 210 and second-type leads 220 connected in parallel, the display effect of the array substrate 2000 may be further improved, and better display uniformity may be achieved.

It should be noted that the number of the second-type leads 220 is not limited to the above case. Exemplarily, in an M×N pixel arrangement, the array substrate includes M first driving signal wires 110 and 2N leads 200, wherein the number of the first-type leads 210 is M and the number of the second-type leads 220 is (2N−M), and each column of pixels includes two leads 200. The relationship between M and N satisfies 2N>M>N, and both M and N are positive integers greater than 1.

Figure 4:
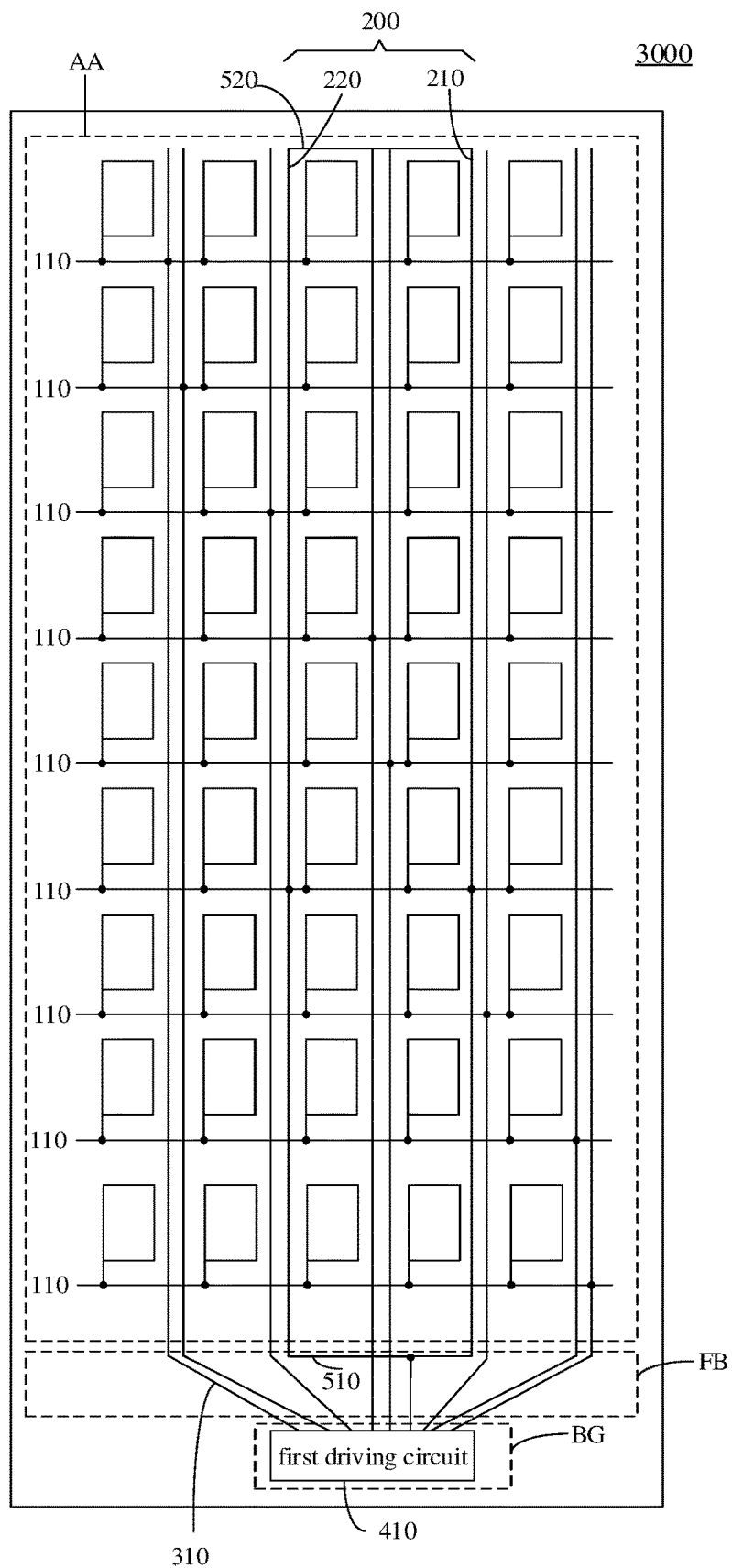
FIG. 4 is a schematic diagram of a partial planar structure of an array substrate according to an embodiment of the present disclosure.

FIG. 4 shows a schematic diagram of a partial planar structure of an array substrate 3000 according to another embodiment of the present disclosure. The structure of the array substrate 3000 in this example is basically the same as the structure of the array substrate 1000 described in FIG. 2 except for the relative positional relationship of the first-type lead 210 and the second-type lead 220 connected in parallel.

As shown in FIG. 4, the first-type lead 210 and the second-type lead 220 connected in parallel are located in different columns of pixels. Specifically, the first-type lead 210 is located in the fourth column of pixels, and the second-type lead 220 is located in the second column of pixels. The first-type lead 210 is electrically connected to the first driving signal wire 110 of the sixth row via the first electrical connection point 160, and the second-type lead 220 is electrically connected to the first driving signal wire 110 of the sixth row via the second electrical connection point 170. One ends of the first-type lead 210 and the second-type lead 220 are electrically connected through the first connection wire 510, and the other ends of the first-type lead 210 and the second-type lead 220 are electrically connected through the second connection wire 520.

Figure 6:
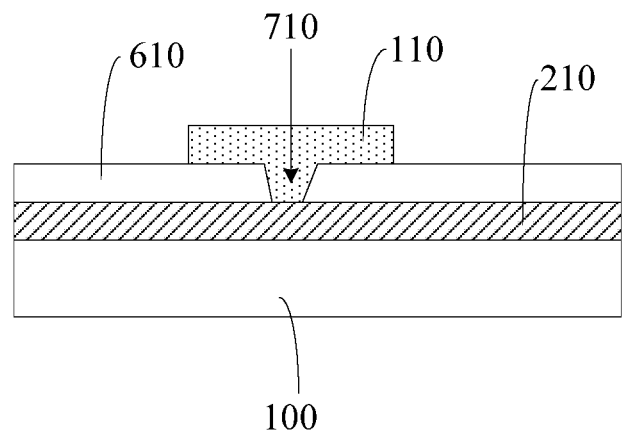
FIG. 6 is a partial cross-sectional view taken along the AA' direction of the array substrate shown in FIG. 5.
Figure 7:
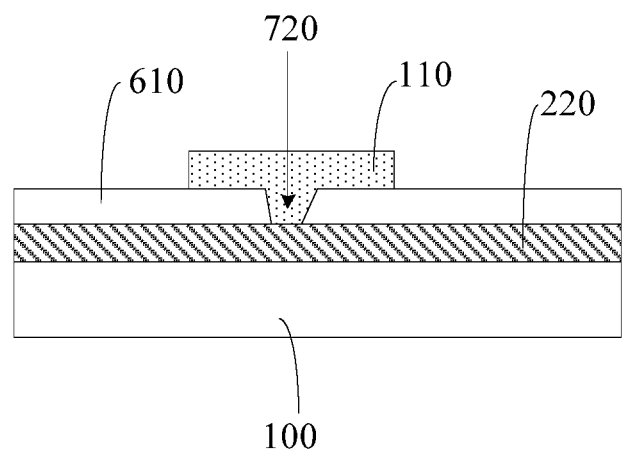
FIG. 7 is a partial cross-sectional view taken along the BB' direction of the array substrate shown in FIG. 5.

FIG. 6 is a partial cross-sectional view taken along the AA' direction of the array substrate 4000 in FIG. 5, and FIG. 7 is a partial cross-sectional view taken along the BB' direction of the array substrate 4000 in FIG. 5. As shown in FIGS. 5 to 7, the array substrate 4000 further includes a first insulating layer 610 between the first driving signal wire 110 and the lead 200 (including the first-type lead 210 and the second-type lead 220) and a substrate 100 on a side of the lead 200 away from the first driving signal wire 110. A first electrical connection hole 710 penetrating the first insulating layer 610 is provided at the overlap of each first-type lead 210 and the corresponding first driving signal wire 110, and each first-type lead 210 is electrically connected to the corresponding first driving signal wire 110 through the corresponding first electrical connection hole 710. A second electrical connection hole 720 penetrating the first insulating layer 610 is provided at the overlap of each second-type lead 220 and the corresponding first driving signal wire 110, and each second-type lead 220 is electrically connected to the corresponding first driving signal wire 110 through the corresponding second electrical connection hole 720. The first electrical connection point 160 between the first-type lead 210 and the corresponding first driving signal wire 110 corresponds to the first electrical connection hole 710, and the second electrical connection point 170 between the second-type lead 220 and the corresponding first driving signal wire 110 corresponds to the second electrical connection hole 720. By way of the electrical connection hole, direct electrical contacts between the first-type lead 210 and the first driving signal wire 110 as well as the second-type lead 220 and the first driving signal wire 110 may be achieved, thereby further improving the electrical connection performance.

Figure 8:
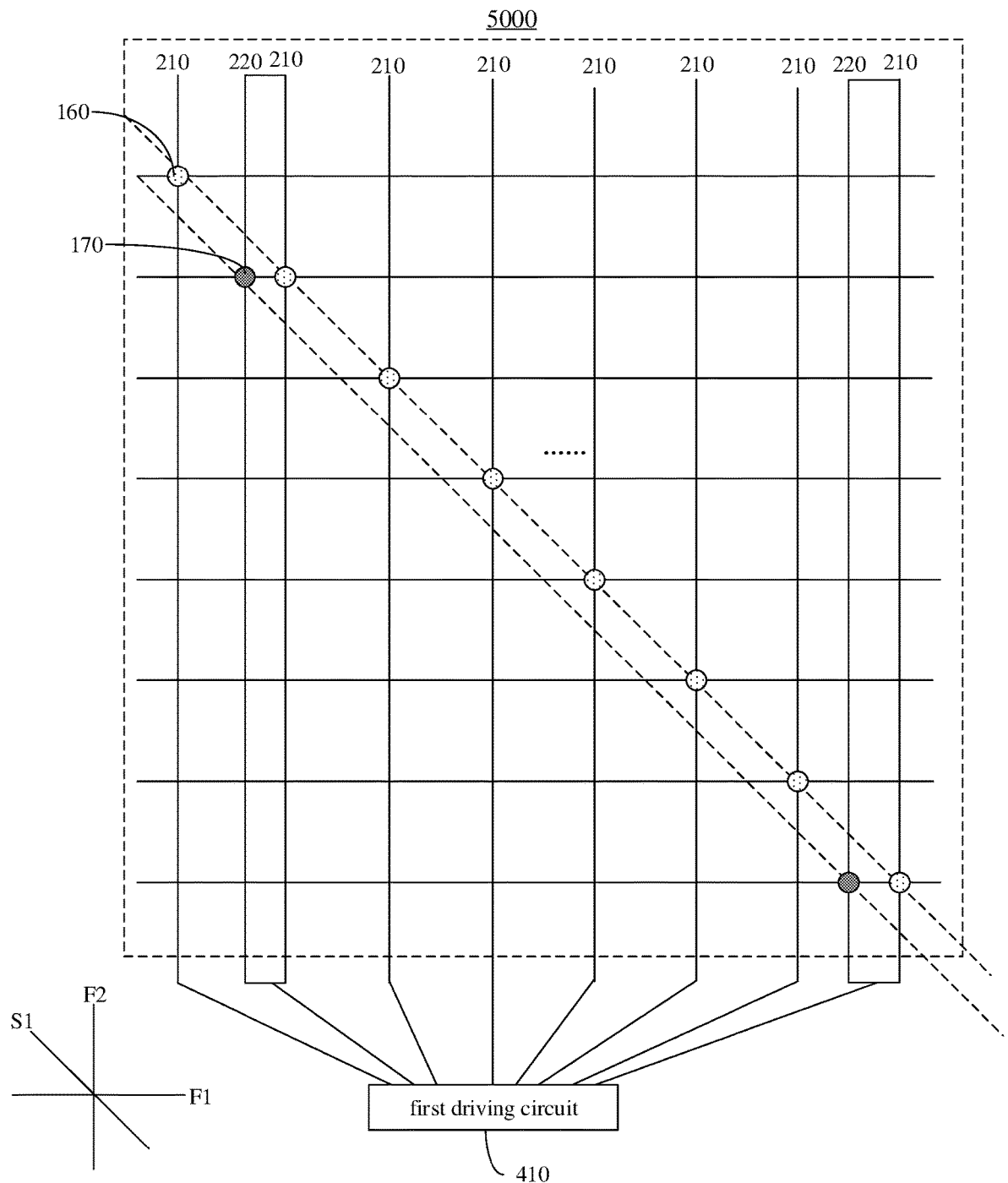
FIG. 8 is a schematic diagram of a partial planar structure of an array substrate according to another embodiment of the present disclosure.

FIG. 8 is a schematic diagram of a partial planar structure of an array substrate 5000 according to another embodiment of the present disclosure. As shown in FIG. 8, the first electrical connection points 160 and the second electrical connection points 170 are evenly distributed in the display area AA, respectively. Specifically, the first electrical connection points 160 are basically arranged on a straight line along a first direction S1, and the second electrical connection points 170 are basically arranged on another straight line along a direction parallel to the first direction S1. The first direction S1 crosses the row direction F1 and the column direction F2, respectively. As shown, the straight line where the first electrical connection points 160 are located is at a side of another straight line where the second electrical connection points 170 are located, that is, the straight line where the first electrical connection points 160 are located and another straight line where the electrical connection points 170 are located are distributed in a "\\" shape. By using the second electrical connection point 170 of the second-type lead 220, the connectivity and stability of signal may be enhanced without increasing the number of fan-out wires required, and at the same time, this design may reduce the difference between the transmission loads of the first-type leads 210, thereby facilitating improvement of the gray scale difference and of the display uniformity of the display device.

Figure 9:
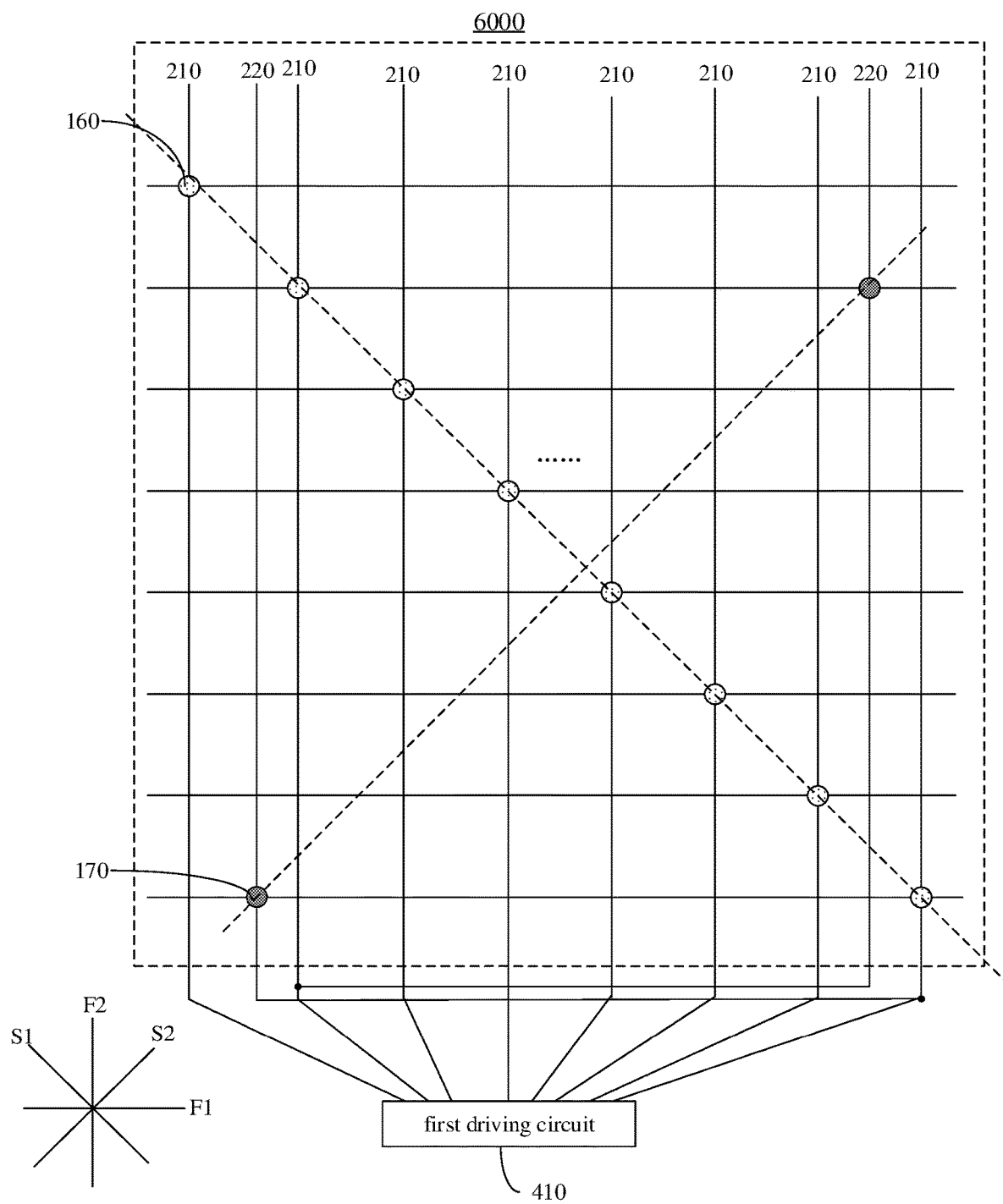
FIG. 9 is a schematic diagram of a partial planar structure of an array substrate according to another embodiment of the present disclosure.

FIG. 9 is a schematic diagram of a partial planar structure of an array substrate 6000 according to another embodiment of the present disclosure. As shown in FIG. 9, the first electrical connection points 160 are basically arranged on a straight line along the first direction S1, and the second electrical connection points 170 are basically arranged on another straight line along a second direction S2. The second direction S2 crosses the row direction F1, the column direction F2, and the first direction S1, respectively. Exemplarily, the straight line where the first electrical connection points 160 are located and another straight line where the second electrical connection points 170 are located are distributed in an "x" shape. Of course, the embodiments of the present disclosure include but are not limited to this shape, and may also arrange in other shapes as needed, which is not limited herein. By using the second electrical connection point 170 of the second-type lead 220, the connectivity and stability of signal may be enhanced without increasing the number of fan-out wires required, and at the same time, this design may reduce the difference between the transmission loads of the first-type leads 210, thereby facilitating improvement of the gray scale difference and of the display uniformity of the display device.

Exemplarily, in an M×N pixel arrangement, the array substrate includes M first driving signal wires 110 and 2N leads 200, wherein the number of the first-type leads 210 is M and the number of the second-type leads 220 is (2N−M), and each column of pixels includes two wires 200. The relationship between M and N satisfies 2N>M>N, and both M and N are positive integers greater than 1. In this case, (2N−M) rows of the first driving signal wire 110 and the lead 200 have two electrical connection points, and (2M−2N) rows of the first driving signal wire 110 and the lead 200 have one electrical connection point.

Figure 10:
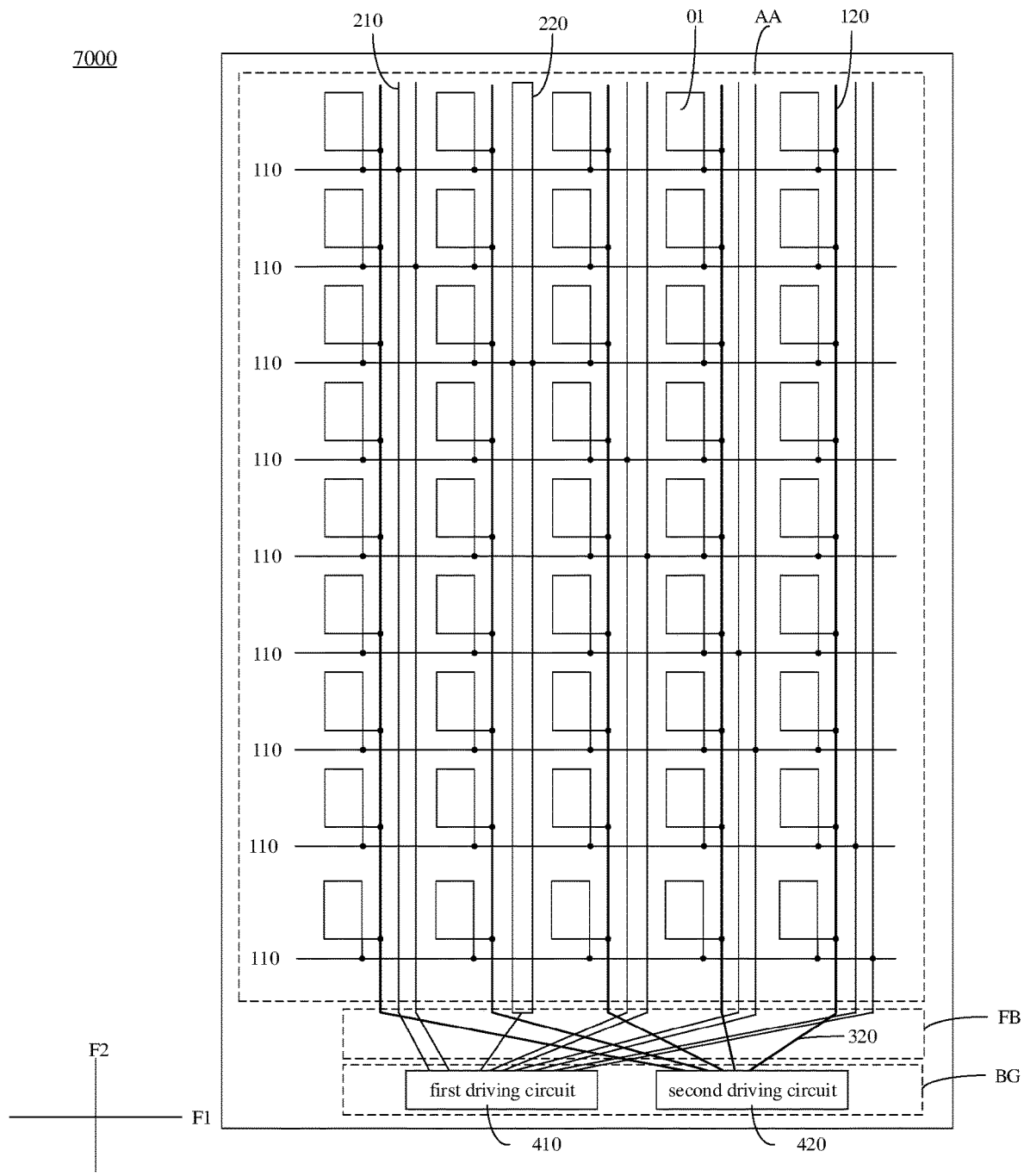
FIG. 10 is a schematic diagram of a partial planar structure of an array substrate according to yet another embodiment of the present disclosure.

FIG. 10 is a schematic diagram of a partial planar structure of an array substrate 7000 according to another embodiment of the present disclosure. The array substrate 7000 further includes a plurality of second driving signal wires 120 extending along the column direction F2, and each second driving signal wire 120 is electrically connected to a respective column of pixels. The fan-out area FB further includes a plurality of second fan-out wires 320, and one second fan-out wire 320 is electrically connected to a respective second driving signal wire 120. The bonding area BG further includes at least one second driving circuit 420 that is electrically connected to at least a portion of the second fan-out wires 320. In one example, the bonding area BG may include one second driving circuit 420 that is electrically connected to all second fan-out wires 320. Of course, the number of the second driving circuit 420 is not limited to this, and it may adopt a flexible design manner according to actual needs.

In some embodiments, the first driving signal wire 110 may be a data line, and the second driving signal wire 120 may be a gate line. Alternatively, the first driving signal wire 110 may be a gate line, and the second driving signal wire 120 may be a data line.

Figure 11A:
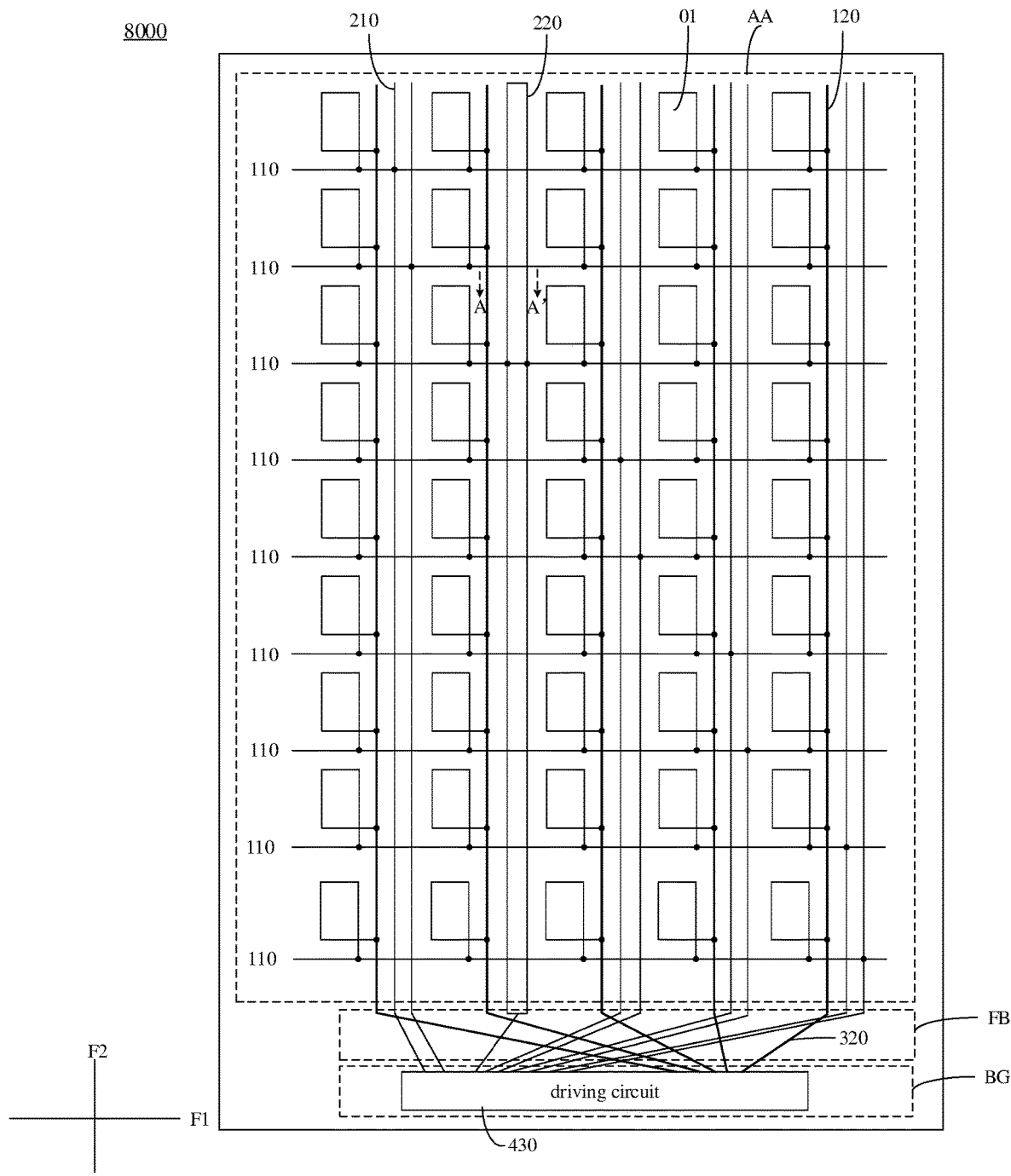
FIG. 11a is a schematic diagram of a partial planar structure of an array substrate according to yet another embodiment of the present disclosure.

In order to improve the integration of the array substrate and reduce the occupied space of the bonding area BG, as shown in FIG. 11a, the first driving circuit and the second driving circuit are integrated into the same driving circuit 430. In other words, a driving circuit 430 may provide signals to the first driving signal wire 110 and the second driving signal wire 120 respectively, enabling a compact array substrate.

Figure 11B:
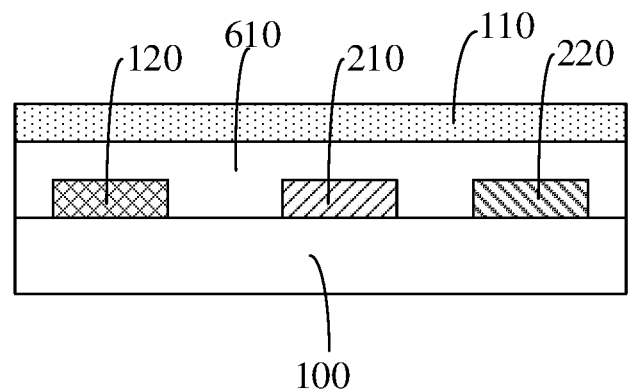

FIG. 11b is a partial cross-sectional view taken along AA' direction of the array substrate 8000 in FIG. 11a. As shown, the first-type lead 210, the second-type lead 220, and the second driving signal wire 120 are provided on the same layer, and may be formed of the same material. In this way, the first-type lead 210, the second-type lead 220, and the second driving signal wire 120 may be formed by one patterning process, thereby simplifying the manufacturing process.

Figure 11C:
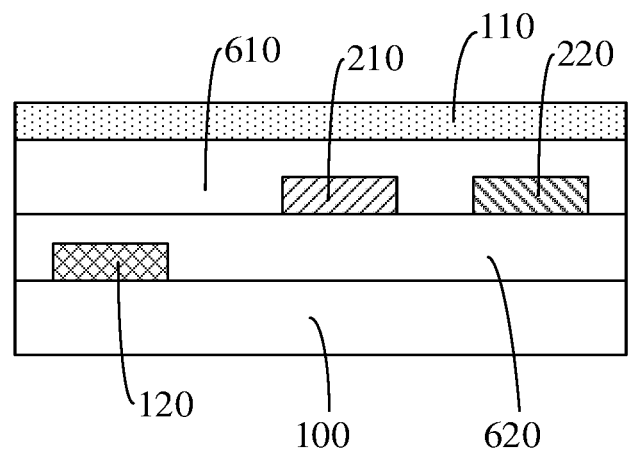

Alternatively, the first-type lead 210, the second-type lead 220, and the second driving signal wire 120 may also be disposed in different layers. As shown in FIG. 11c, the second driving signal wire 120 is located between the layer where the first-type lead 210 and the second-type lead 220 are located and the substrate 100, and a second insulating layer 620 is provided between the layer where the second driving signal wire 120 is located and the layer where the first-type lead 210 and the second-type lead 220 are located and covers the second driving signal wire 120, to electrically insulate the second driving signal wire 120 from the first-type lead 210 and the second-type lead 220, respectively. The first insulating layer 610 and the second insulating layer 620 may be formed of the same material or different materials.

Figure 12:
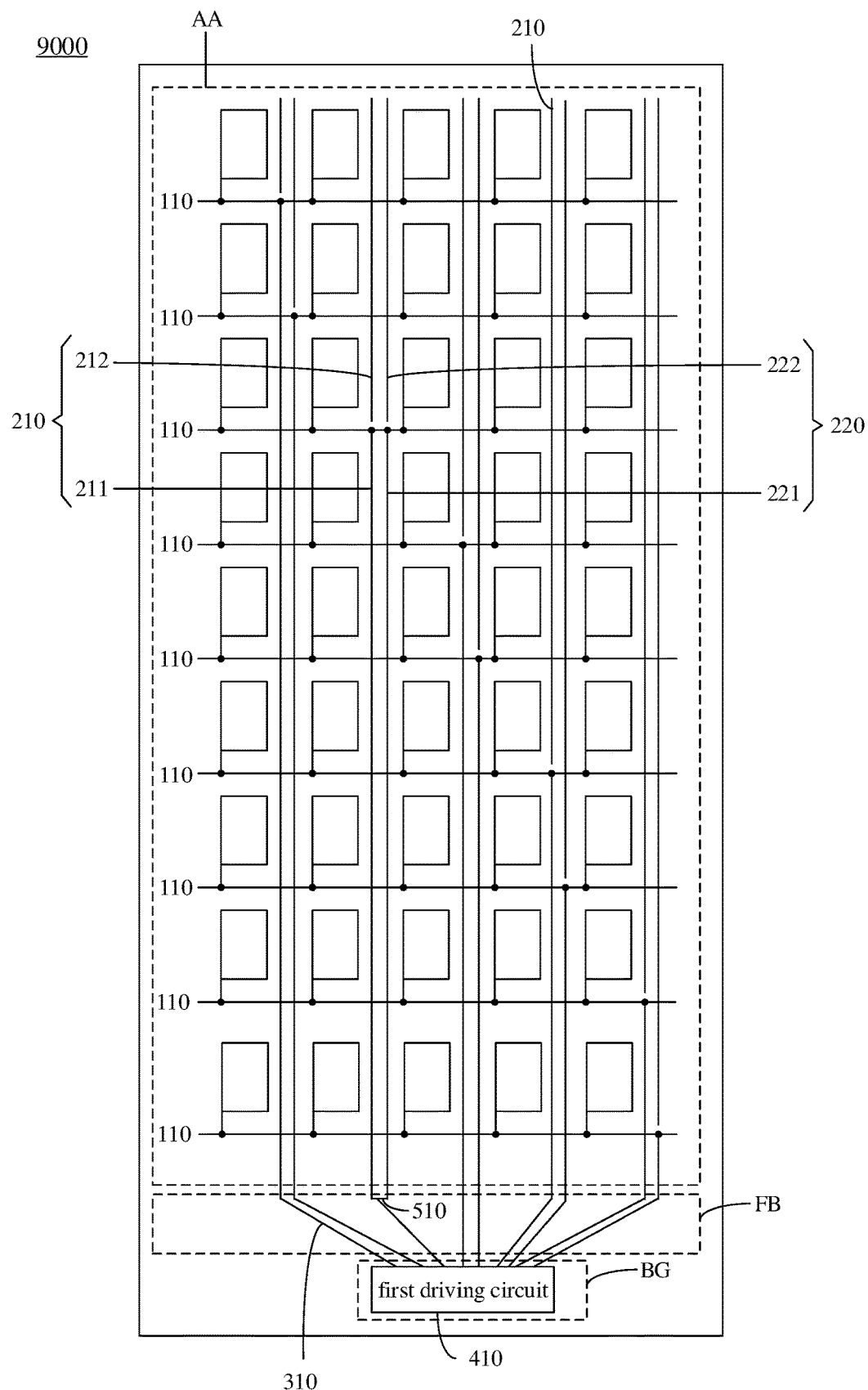
FIG. 12 is a schematic diagram of a partial planar structure of an array substrate according to still another embodiment of the present disclosure.

FIG. 12 is an array substrate 9000 according to another embodiment of the present disclosure. The array substrate 9000 is a partial variation of the above-mentioned array substrate 1000. Therefore, for the sake of brevity, only the differences between this embodiment and the above-mentioned embodiments are described below, and the similarities are not repeated herein.

As shown, each first-type lead 210 includes a first sub-lead portion 211 and a second sub-lead portion 212 spaced apart from each other, and the second-type lead 220 includes a third sub-lead portion 221 and a fourth sub-lead portion 222 spaced apart from each other. The first sub-lead portion 211 is electrically connected to a respective one of the first driving signal wires 110 via the first electrical connection point 160, and the second sub-lead portion 212 is floating. The third sub-lead portion 221 is electrically connected to a respective one of the first driving signal wires 110 via the second electrical connection point 170, and the fourth sub-lead portion 222 is floating. The third sub-lead portion 221 of the second-type lead 220 is connected in parallel with the first sub-lead portion 211 of the corresponding one of the first-type leads 210. The first sub-lead portion 211 of the first-type lead 210 is electrically connected to the first driving circuit 410 through the respective first fan-out wire 310.

In the case where a column of pixels includes only the first-type lead 210, the first fan-out wire 310 and the first sub-lead portion 211 of the first-type lead 210 form a signal transmission path and have a first transmission load. In the case where a column of pixels includes the first-type lead 210 and the second-type lead 220, the first fan-out wire 310 as well as the first sub-lead portion 211 of the first-type lead 210 and the third sub-lead portion 221 of the second-type lead 220 connected in parallel form a signal transmission path and have a second transmission load.

When the first sub-lead portion 211 of the first-type lead 210 is not connected in parallel with the third sub-lead portion 221 of the second-type lead 220, the load of the first sub-lead portion 211 of the first-type lead 210 is RC. After the first sub-lead portion 211 of the first-type lead 210 is connected in parallel with the third sub-lead portion 221 of the second-type lead 220, the resistance R' of the first sub-lead portion 211 is reduced by about half, that is R'=½R, and the capacitance C' of the first sub-lead portion 211 is approximately doubled, that is, C'=2C, therefore, the load of the first sub-lead portion 211 of the first-type lead 210 connected in parallel with the second-type lead 220 satisfies R'C'=RC. Therefore, by connecting the first-type lead 210 and the second-type lead 220 in parallel, the first transmission load may be substantially equal to the second transmission load. The delay time (T) of the signal input to the first driving signal wire 110 satisfies τ∝RC, since the first sub-lead portion 211 connected in parallel with the third sub-lead portion 221 has substantially the same transmission load as the single first sub-lead portion 211 in other columns which is not connected in parallel with the third sub-lead portion 221, the first driving signal wires 110 in rows have approximately the same signal delay time, so that each row of pixels has approximately the same charging time and charging rate, and hence the display uniformity of the display device including the array substrate may be improved.

Figure 13:
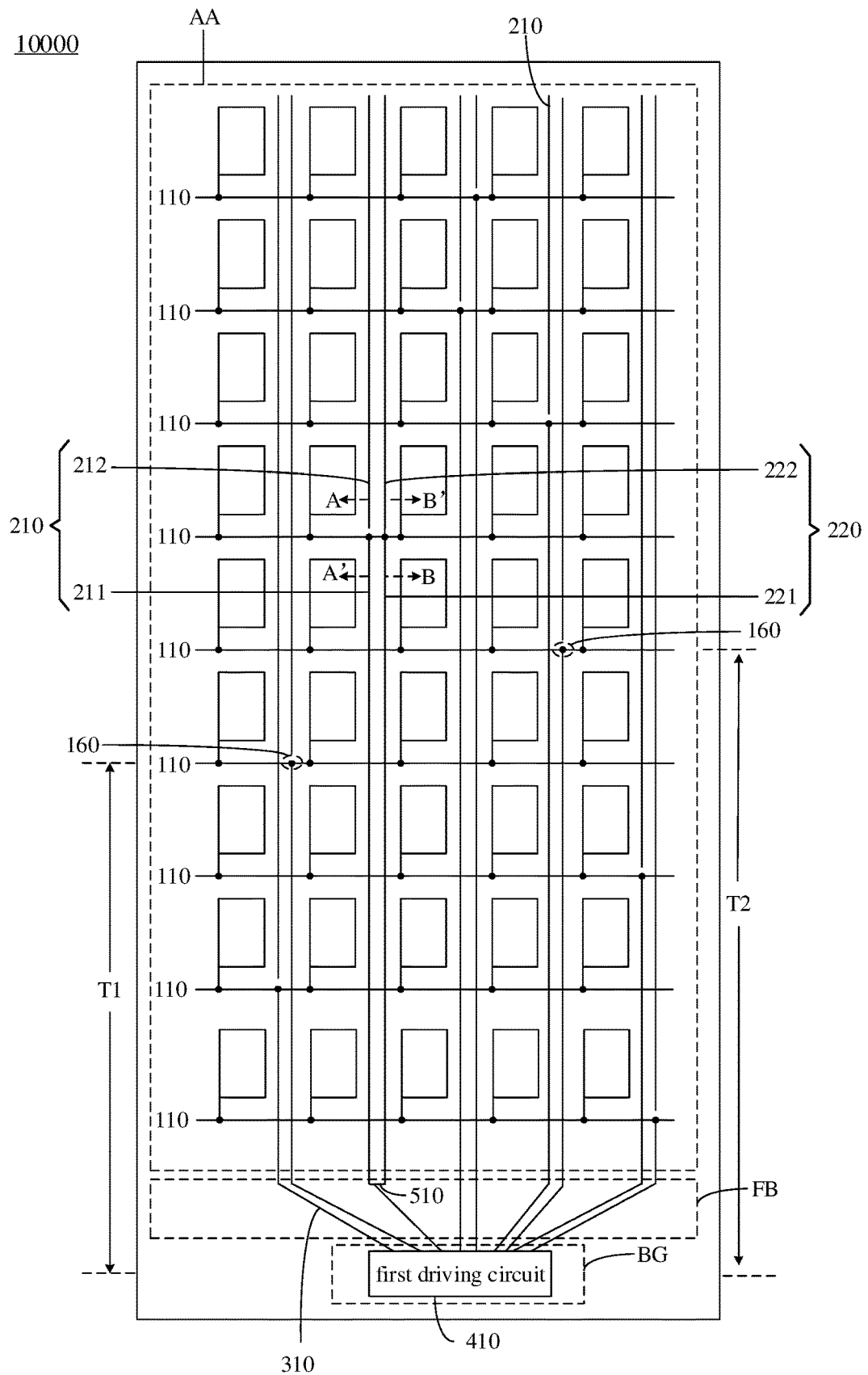
FIG. 13 is a schematic diagram of a partial planar structure of an array substrate according to still another embodiment of the present disclosure.

In order to further improve the consistency of the transmission load, the arrangement of the array substrate 10000 shown in FIG. 13 is further optimized. As shown, the pixel array includes a middle column portion and edge column portions on both sides relative to the first driving circuit 410, and a maximum distance between the first electrical connection points 160 at the edge column portions on both sides and the first driving circuit 410 is a first distance T1, a minimum distance between the first electrical connection points 160 at the middle column portion and the first driving circuit 410 is a second distance T2. The first distance T1 is smaller than the second distance T2. Meanwhile, the lengths of the first fan-out wires 310 corresponding to the edge column portions on both sides are longer than the lengths of the first fan-out wires 310 corresponding to the middle column portion.

Specifically, the array substrate 10000 includes five columns of pixels, which from left to right are the first column of pixels, the second column of pixels, the third column of pixels, the fourth column of pixels, and the fifth column of pixels. The first column of pixels and the fifth column of pixels are edge column portions on both sides with respect to the first driving circuit 410, and the second column of pixels, the third column of pixels, and the fourth column of pixels are the middle column portion with respect to the first driving circuit 410. Compared with the first column of pixels and the fifth column of pixels, the distance between the first electrical connection point 160 of the second first-type lead 210 (counted from left to right) in the first column and the first driving circuit 410 is the largest, which is the first distance T1. Compared with the second column of pixels, the third column of pixels, and the fourth column of pixels, the distance between the first electrical connection point 160 of the second first-type lead 210 (counted from left to right) in the fourth column and the first driving circuit 410 is the smallest, which is the second distance T2. The first distance T1 is smaller than the second distance T2. Meanwhile, the lengths of the first fan-out wires 310 corresponding to the first column of pixels and the fifth column of pixels are longer than the lengths of the first fan-out wires 310 corresponding to the second column of pixels, the third column of pixels, and the fourth column of pixels.

With this arrangement, the transmission loads RC of the first-type lead 210 and the respective first fan-out wire 310 may be adjusted so that the signal transmission wires (including the first-type lead 210 (and the second-type lead 220), the corresponding first fan-out wire 310) in different columns of pixels have the same transmission load. Therefore, each row of pixels has the same delay time τ, so that each row of pixels has the same charging time and charging rate, thereby further improving the display uniformity of the display device including the array substrate.

Figure 14:
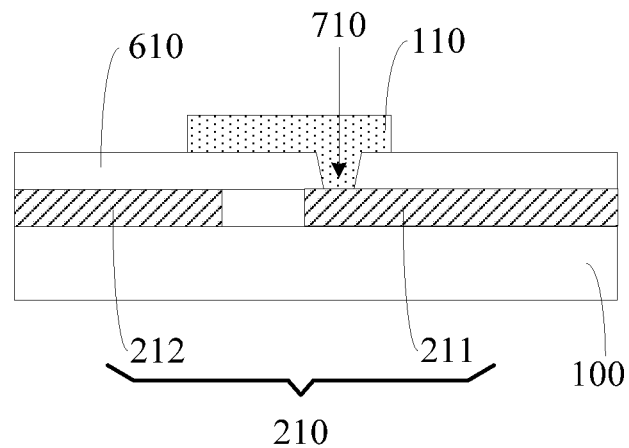
FIG. 14 is a partial cross-sectional view taken along the AA' direction of the array substrate shown in FIG. 13.
Figure 15:
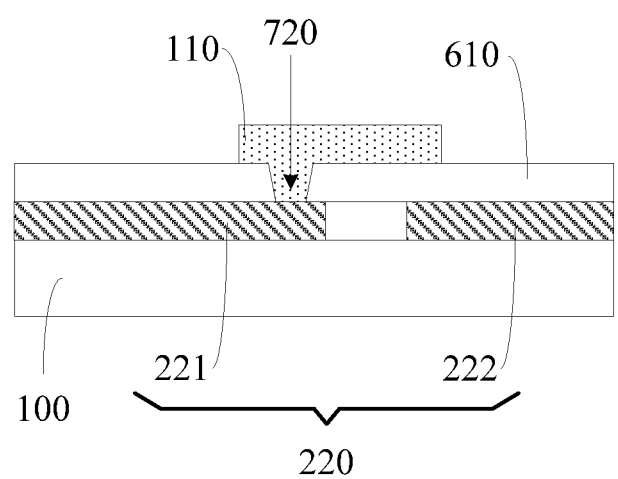
FIG. 15 is a partial cross-sectional view taken along the BB' direction of the array substrate shown in FIG. 13.

FIG. 14 is a partial cross-sectional view taken along the AA' direction of the array substrate 10000 shown in FIG. 13, and FIG. 15 is a partial cross-sectional view taken along the BB' direction of the array substrate 10000 shown in FIG. 13.

As shown in FIG. 14, the first driving signal wire 110 has a first orthographic projection on the substrate 100, a gap between the first sub-lead portion 211 and the second sub-lead portion 212 of the first-type lead 210 electrically connected to the first driving signal wire 110 has a second orthographic projection on the substrate 100, and the first orthographic projection covers the second orthographic projection. As shown in FIG. 15, the first driving signal wire 110 has a first orthographic projection on the substrate 100, a gap between the third sub-lead portion 221 and the fourth sub-lead portion 222 of the second-type lead 220 electrically connected to the first driving signal wire 110 has a third orthographic projection on the substrate 100, and the first orthographic projection covers the third orthographic projection. With this arrangement, the first driving signal wire 110 may better shield the disconnection of the first-type lead 210 and the disconnection of the second-type lead 220, thereby achieving better optical uniformity.

In an embodiment where the light emitting side of the array substrate is a side of the first driving signal wire 110 facing away from the substrate 100, the first-type lead 210 may be disposed between the first driving signal wire 110 and the substrate 100. In an embodiment where the light emitting side of the array substrate is a side of the first driving signal wire 110 facing the substrate 100, the first-type lead 210 may be disposed on a side of the first driving signal wire 110 facing away from the substrate 100.

In an embodiment where the light emitting side of the array substrate is a side of the first driving signal wire 110 facing away from the substrate 100, the second-type lead 220 may be disposed between the first driving signal wire 110 and the substrate 100. In an embodiment where the light emitting side of the array substrate is a side of the first driving signal wire 110 facing the substrate 100, the second-type lead 220 may be disposed on a side of the first driving signal wire 110 facing away from the substrate 100.

In the array substrate provided by the embodiments of the present disclosure, at least one row of pixels is electrically connected to at least one first driving signal wire, and different rows of pixels are electrically connected to different first driving signal wires, so that signals may be transmitted to the pixels through the first driving signal wire. The first driving signal wire is electrically connected to at least one first-type lead, so that the signal may be transmitted to the first driving signal wire through the first-type lead. Moreover, at least one first driving signal wire is electrically connected to at least one second-type lead, so that the second-type lead is connected in parallel with the first-type lead, which may not only reduce the resistance of the first-type lead, but also increase the capacitance of the first-type lead. Therefore, the load of the first-type lead connected in parallel with the second-type lead is basically unchanged. In addition, by connecting the second-type lead to the first-type lead in parallel, the influence of the second-type lead on the adjacent first-type lead is substantially the same as the influence between the adjacent first-type leads, that is, the load of each first-type lead is approximately the same, so that the signal delay time of the first driving signal wires may be approximately the same, and thus the problem of uneven display caused by different loads may be solved or at least improved. By making each column of pixels correspond to the same number of leads, the size and characteristic of each column of pixels may be substantially the same. Moreover, by matching the loads of the fan-out wire and the corresponding first-type lead, the transmission load on the signal transmission path may be further kept consistent.

The array substrate provided by the embodiments of the present disclosure may be used in any suitable electronic products such as an electronic paper display, a liquid crystal display, an organic light emitting diode displays, and the like.

The electronic paper display is a display which uniformly disperses the dyed charged particles into a medium solution with a certain viscosity, and uses an electric field to cause the dyed charged particles to perform electrophoretic movement to produce a color display. Since the color display is realized by the colored particles reflecting external light, the electronic paper display may have the effect of ordinary paper during display, winning readers' like. In addition, since the electronic paper display is displayed by reflecting external light, it is not necessary to additionally provide a backlight. Generally, the electronic paper display may include an array substrate and a counter substrate that are oppositely arranged, and a dyed charged particle layer encapsulated between the array substrate and the counter substrate. Moreover, the display area of the electronic paper display is generally provided with multiple display units. The array substrate provided by the embodiments of the present disclosure may be the array substrate applied in the electronic paper display. In this case, one pixel structure in the embodiments of the present disclosure is equivalent to the above-mentioned one display unit. The pixel structure may include a pixel electrode on the substrate 100 and a thin film transistor electrically connected to the pixel electrode. Of course, the substrate 100 is also provided with a gate line that transmits a gate scan signal and a data line that transmits a data signal. In this way, the gate scan signal is input to the thin film transistor through the gate line to control the conduction of the thin film transistor, so that the data signal transmitted on the data line is input to the pixel electrode and the pixel electrode is input with a voltage, and then the dyed charged particles are driven to display images.

The liquid crystal display (LCD) panel has advantages such as light and thin appearance, power saving and no radiation and has been widely used. The working principle of the LCD panel is to change the arrangement of the liquid crystal molecules in the liquid crystal layer by changing the voltage difference across the liquid crystal layer, so as to change the light transmittance of the liquid crystal layer, thereby displaying an image. Generally, the LCD panel may include an array substrate and a counter substrate that are oppositely arranged, and a liquid crystal layer encapsulated between the array substrate and the counter substrate. Moreover, the display area of the LCD panel is generally provided with multiple display units, and each display unit may include multiple sub-display units. For example, the display unit may include a red sub-display unit, a green sub-display unit, and a blue sub-display unit, so as to achieve a color display by mixing red, green, and blue colors. Alternatively, the display unit may also include a red sub-display unit, a green sub-display unit, a blue sub-display unit, and a white sub-display unit, so as to achieve a color display by mixing red, green, blue, and white colors. The array substrate provided by the embodiments of the present disclosure may be the array substrate applied in the LCD panel. In this case, one pixel structure in the embodiments of the present disclosure is equivalent to the above-mentioned one sub-display unit. The pixel structure may include a pixel electrode on the substrate 100 and a thin film transistor electrically connected to the pixel electrode. Of course, the substrate 100 is also provided with a gate line that transmits a gate scan signal and a data line that transmits a data signal. In this way, the gate scan signal is input to the thin film transistor through the gate line to control the conduction of the thin film transistor, so that the data signal transmitted on the data line is input to the pixel electrode and the pixel electrode is input with a voltage, and then the liquid crystal molecules are driven to rotate to display an image.

Electroluminescent diodes such as organic light emitting diodes (OLED), micro light emitting diodes (Micro-LED), quantum dot light emitting diodes (QLED) have advantages such as self-luminous, low energy consumption, and the like. The electroluminescence display panel generally includes an array substrate and a counter substrate that are oppositely arranged, and the display area of the electroluminescence display panel generally includes a plurality of display units, and each display unit may include a plurality of sub-display units. The display unit may include a red sub-display unit, a green sub-display unit, and a blue sub-display unit, so as to achieve a color display by mixing red, green, and blue colors. Alternatively, the display unit may also include a red sub-display unit, a green sub-display unit, a blue sub-display unit, and a white sub-display unit, so as to achieve a color display by mixing red, green, blue, and white colors. The array substrate provided in the embodiments of the present disclosure may be the array substrate used in the electroluminescent display panel. In this case, one pixel structure in the embodiments of the present disclosure is equivalent to the above-mentioned one sub-display unit. The pixel structure may include an electroluminescent diode on the substrate 100 and a driving circuit for driving the electroluminescent diode to emit light. In addition, a gate line for transmitting a gate scan signal and a data line for transmitting a data signal are also provided on the substrate 100. In this way, the gate scan signal is input to the driving circuit through the gate line to control the switching transistor in the driving circuit to be turned on, so that the data signal transmitted on the data line is input to the driving transistor to drive the electroluminescent diode to emit light. The driving circuit may usually include a plurality of transistors such as a driving transistor, a switching transistor, and a storage capacitor. The specific structure and working principle of the driving circuit, reference may be made to related technical content, and details are not described herein.

Figure 16:
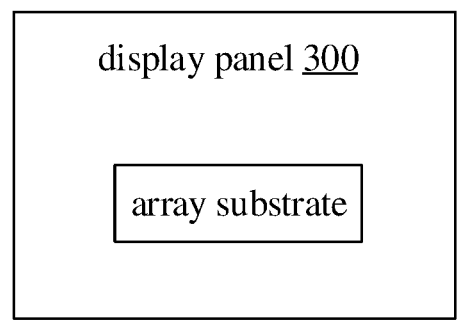
FIG. 16 is a structural block diagram of a display panel according to an embodiment of the present disclosure.

Based on the same inventive concept, an embodiment of the present disclosure also provides a display panel. As shown in FIG. 16, the display panel 300 includes the above-mentioned array substrate provided by any of embodiments of the present disclosure. The display panel 300 includes any suitable display panel such as a liquid crystal display panel, an organic light emitting diode display panel, and the like. The display panel 300 may achieve substantially the same technical effects and solve basically the same technical problems as the above-mentioned array substrate. Therefore, for the implementation of the display panel 300, reference may be made to the implementation of the foregoing array substrate, and details are not described herein again.

Figure 17:
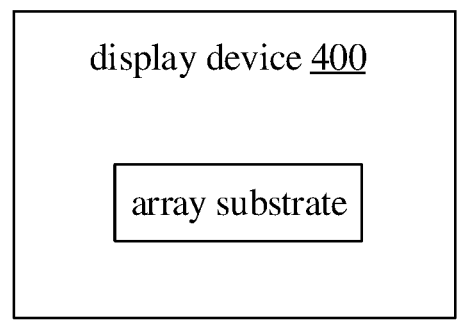
FIG. 17 is a structural block diagram of a display device according to an embodiment of the present disclosure.

Based on the same inventive concept, an embodiment of the present disclosure also provides a display device. As shown in FIG. 17, the display device 400 includes the above-mentioned array substrate provided by any of embodiments of the present disclosure. The display device 400 may achieve substantially the same technical effects and solve basically the same technical problems as the above-mentioned array substrate. Therefore, for the implementation of the display device 400, reference may be made to the implementation of the foregoing array substrate, and details are not described herein again.

The display device may include any product or component with a display function such as a mobile phone, a tablet computer, a television, a display, a notebook computer, a digital photo frame, a navigator, and the like. Other necessary components of the display device should be understood by those of ordinary skill in the art, and are not repeated herein, nor should they be considered as a limitation to the present disclosure.

It should be noted that, in the actual process, due to the limitations of process conditions or other factors, the "same" described with respect to the above features may not be completely the same, there may be some deviations, so as long as the "same" described with respect to the above features generally meets the conditions, which belongs to the scope of protection of the present disclosure. For example, the above-mentioned same may be the same allowed within the error allowable range.

It should be noted that, without conflict, the features found in one embodiment may be combined with the features found in another embodiment to implement more embodiments.

Those skilled in the art may make various modifications and variations to the embodiments of the present disclosure without departing from the spirit and scope of the present disclosure. In this way, if these modifications and variations of the embodiments of the present disclosure fall within the scope of the claims of the present disclosure and equivalent technologies thereof, the present disclosure is intended to encompass these modifications and variations.

The invention claimed is:

1. An array substrate, comprising:
   a plurality of pixel structures in a display area of the array substrate and arranged in rows and columns;
   a plurality of first driving signal wires extending in a row direction; and
   a plurality of leads extending in a column direction crossing the row direction, the plurality of leads comprising a plurality of first-type leads and at least one second-type lead,
   wherein a respective one of the plurality of first driving signal wires is electrically connected to a respective row of the plurality of pixel structures and is electrically connected to a respective one of the plurality of first-type leads via a first electrical connection point,
   wherein the at least one second-type lead is electrically connected to a respective one of the plurality of first driving signal wires via a second electrical connection point and is connected in parallel with a corresponding first-type lead of the plurality of first-type leads electrically connected to the respective one of the plurality of first driving signal wires, and
   wherein the plurality of pixel structures are arranged in an M×N array, a number of the first-type leads is M, a number of the at least one second-type leads is (2N−M), a relationship between M and N satisfies 2N>M>N, and both M and N are positive integers greater than 1.

2. The array substrate according to claim 1, wherein the corresponding first-type lead and the at least one second-type lead connected in parallel are in a same column or different columns of the pixel structures.

3. The array substrate according to claim 1, wherein respective columns of the plurality of pixel structures comprise a same number of the plurality of leads.

4. The array substrate according to claim 1, further comprising:
   at least one first connection wire; and
   at least one second connection wire,
   wherein one end of each of the first-type lead and the at least one second-type lead connected in parallel are electrically connected via the at least one first connecting wire, and
   wherein another end of each of the first-type lead and the at least one second-type lead connected in parallel are electrically connected via the at least one second connection wire.

5. The array substrate according to claim 1, further comprising:
   a fan-out area in a non-display area of the array substrate,
   wherein the fan-out area comprises a plurality of first fan-out wires, and
   wherein a respective one of the plurality of first fan-out wires is electrically connected to a respective one of the plurality of first-type leads.

6. The array substrate according to claim 5, further comprising:
   at least one first driving circuit,
   wherein the at least one first driving circuit is electrically connected to the plurality of first fan-out wires to transmit driving signals to the plurality of first driving signal wires, and
   wherein each of the plurality of first-type leads has substantially a same transmission load.

7. The array substrate according to claim 6,
   wherein each of the plurality of first-type leads comprises a first sub-lead portion and a second sub-lead portion spaced apart from each other,
   wherein the first sub-lead portion is electrically connected to a respective one of the plurality of first driving signal wires via the first electrical connection point,
   wherein the second sub-lead portion is floating,
   wherein the at least one second-type lead comprises a third sub-lead portion and a fourth sub-lead portion spaced apart from each other,
   wherein the third sub-lead portion is electrically connected to a respective one of the plurality of first driving signal wires via the second electrical connection point,
   wherein the fourth sub-lead portion is floating, and
   wherein the third sub-lead portion of the at least one second-type lead is connected in parallel with the first sub-lead portion of the respective one of the plurality of first-type leads.

8. The array substrate according to claim 7,
   wherein one of the plurality of first driving signal wires has a first orthographic projection on the array substrate,
   wherein a gap between the first sub-lead portion and the second sub-lead portion of a corresponding first-type lead electrically connected to the first driving signal wire has a second orthographic projection on the array substrate, and
   wherein the first orthographic projection overlaps the second orthographic projection.

9. The array substrate according to claim 7,
   wherein one of the plurality of first driving signal wires has a first orthographic projection on the array substrate,
   wherein a gap between the third sub-lead portion and the fourth sub-lead portion of the at least one second-type lead electrically connected to the first driving signal wire has a third orthographic projection on the array substrate, and wherein the first orthographic projection overlaps the third orthographic projection.

10. The array substrate according to claim 7,
wherein the plurality of pixel structures comprise a middle column portion and edge column portions on both sides with respect to the at least one first driving circuit, wherein a maximum distance between the first electrical connection points at the edge column portions on both sides and the at least one first driving circuit comprises a first distance, wherein a minimum distance between the first electrical connection points at the middle column portion and the at least one first driving circuit comprises a second distance, wherein the first distance is less than the second distance, and wherein lengths of the first fan-out wires corresponding to the edge column portions on both sides are longer than lengths of the first fan-out wires corresponding to the middle column portion.

11. The array substrate according to claim 6, further comprising:
a plurality of second driving signal wires extending in the column direction, wherein a respective one of the plurality of second driving signal wires is electrically connected to a respective column of the plurality of pixel structures.

12. The array substrate according to claim 11,
wherein the fan-out area further comprises a plurality of second fan-out wires, wherein a respective one of the plurality of second fan-out wires is electrically connected to a respective one of the plurality of second driving signal wires, wherein the array substrate further comprises at least one second driving circuit, and wherein the plurality of second fan-out wires are electrically connected to the at least one second driving circuit.

13. The array substrate according to claim 12, wherein the at least one first driving circuit and the at least one second driving circuit are integrated into a same driving circuit.

14. The array substrate according to claim 11,
wherein the first driving signal wire is selected from one of a data line and a gate line, and wherein the second driving signal wire is selected from another of the data line and the gate line.

15. A display panel comprising the array substrate according to claim 1.

16. A display device comprising the array substrate according to claim 1.

17. The array substrate according to claim 1,
wherein a plurality of the first electrical connection points are substantially in a straight line in a first direction, wherein the first direction crosses the row direction and the column direction respectively.

18. The array substrate according to claim 17, wherein a plurality of the second electrical connection points are substantially in another straight line in a direction parallel to the first direction.

19. The array substrate according to claim 17,
wherein a plurality of the second electrical connection points are substantially in a straight line in a second direction, wherein the second direction crosses the row direction, the column direction and the first direction respectively.

* * * * *